(12) United States Patent
Wang et al.

(10) Patent No.: US 7,019,552 B2
(45) Date of Patent: Mar. 28, 2006

(54) LINE DRIVER WITH ACTIVE TERMINATION

(75) Inventors: Wen-Chi Wang, Siluo (TW); Chao-Cheng Lee, Jhongli (TW); Jui-Yuan Tsai, Tainan (TW)

(73) Assignee: Realtek Semiconductor Corp., Hsinchu (TW)

( * ) Notice: Subject to any disclaimer, the term of this patent is extended or adjusted under 35 U.S.C. 154(b) by 55 days.

(21) Appl. No.: 10/724,779

(22) Filed: Dec. 2, 2003

(65) Prior Publication Data

US 2004/0119834 A1 Jun. 24, 2004

(30) Foreign Application Priority Data

Dec. 18, 2002 (TW) .............................. 91136568 A

(51) Int. Cl.
*H03K 17/16* (2006.01)
(52) U.S. Cl. ........................ 326/30; 326/26; 327/108
(58) Field of Classification Search ................ 326/30, 326/26, 82; 327/108; 330/69, 260
See application file for complete search history.

(56) References Cited

U.S. PATENT DOCUMENTS

| | | | | |
|---|---|---|---|---|
| 3,500,223 | A | * | 3/1970 | Thurnell ..................... 330/254 |
| 4,395,682 | A | * | 7/1983 | Yokobori et al. ........... 330/260 |
| 4,798,982 | A | | 1/1989 | Voorman |
| 5,121,080 | A | | 6/1992 | Scott, III et al. |
| 5,614,864 | A | * | 3/1997 | Stubbe et al. ................ 330/69 |
| 5,699,016 | A | * | 12/1997 | Federspiel et al. .......... 330/260 |
| 6,314,180 | B1 | | 11/2001 | Bingel |
| 6,522,179 | B1 | | 2/2003 | Ferianz |
| 2002/0070770 | A1 | | 6/2002 | Ferianz ....................... 327/108 |

FOREIGN PATENT DOCUMENTS

DE 010045720 A1 * 4/2002

OTHER PUBLICATIONS

Bram Nauta et. al., *Analog Line Driver with Adaptive Impedance Matching*, IEEE Journal of Solid-State Circuits, vol. 33, No. 12, Dec. 1998, pp. 1992-1998.

(Continued)

*Primary Examiner*—Daniel Chang
(74) *Attorney, Agent, or Firm*—Bacon & Thomas, PLLC

(57) ABSTRACT

The line driver with active termination includes: a differential amplifier having an inverting output terminal, a non-inverting output terminal, an inverting input terminal, and a non-inverting input terminal; a first resistor unit coupled to the inverting input terminal; a impedance matching resistor unit coupled to the non-inverting output terminal; and a resistive feedback network, having a plurality of resistors in symmetric configuration. The resistive feedback network further includes: a second resistor unit coupled to the impedance matching resistor unit and the inverting input terminal; a third resistor unit coupled to the non-inverting output terminal and the inverting input terminal; a fourth resistor unit coupled to the impedance matching resistor unit and the inverting input terminal; and a fifth resistor unit coupled to the inverting output terminal and the inverting input terminal. Each of the resistor units and the impedance matching resistor unit includes a plurality of resistors in symmetric configuration.

4 Claims, 4 Drawing Sheets

OTHER PUBLICATIONS

M. Corsi et. al., *An ADSL Central Office Analog Front-End Integrating Actively-Terminated Line Driver, Receiver and Filters.*, 2001 IEEE International Sold-State Circuits Conference.

Faramarz Sabouri et. al., *A 740mW ADSL Line Driver for Central Office with 75dB MTPR,* 2002 IEEE International Solid-State Circuits Conference.

* cited by examiner

LINE DRIVER WITH ACTIVE TERMINATION

BACKGROUND OF THE INVENTION

1. Field of the Invention

The present invention relates to a technical field of a line driver and, more particularly, to a line driver with active termination.

2. Description of Related Art

In wired communication systems, a transmission line is commonly used to transmit signals while a line driver is used to drive the transmission line. The typical line driver can be either a voltage mode driver or a current mode driver. FIG. 1A shows a conventional voltage mode line driver. In order to reduce the reflection and energy loss of a transmitting signal, a resistor Rs is required to provide the impedance matching. When Rs=RL, the reflecting signal is minimum and the power transfer is maximum. The magnitude of the signal outputted from the voltage mode line driver 10 has to be double to the signal transmitted on the transmission line because of the impedance matching resistor Rs. Therefore, a voltage source for providing higher voltage power is needed to be the power supply for the driver 10.

FIG. 1B shows a conventional voltage mode line driver which is the improvement of the conventional voltage mode line driver shown in FIG. 1A. In FIG. 1B, Rs'=0.1*Rs and a voltage gain of a voltage amplifier has a voltage gain of 10. Due to the voltage gain of 10 in the voltage amplifier 20, an equivalent output impedance is 10*Rs'=10*0.1*Rs=Rs and thus the performance of the original impedance match is achieved. However, a voltage amplifier 20 and two resistors Ra and Rb are needed in the conventional voltage mode line driver shown in FIG. 1B. The amplifier in FIG. 1B is a non-inverting type amplifier. The linearity requirement of the operation range of the non-inverting type amplifier is strictly. Thus, the circuit design of the non-inverting type amplifier is complicated. The voltage amplifier 20 needs a wider single gain bandwidth to maintain the stability of the circuit.

Therefore, it is desirable to provide an improved line driver with active termination to mitigate and/or obviate the aforementioned problems.

SUMMARY OF THE INVENTION

The object of the present invention is to provide a line driver with active termination, which reduces the voltage amplitude of a signal outputted by the line driver.

According to the object of the present invention, the line driver with active termination includes: a differential amplifier having an inverting output terminal, a non-inverting output terminal, an inverting input terminal, and a non-inverting input terminal; a first resistor unit coupled to the inverting input terminal; a impedance matching resistor unit coupled to the non-inverting output terminal; and a resistive feedback network, having a plurality of resistors in symmetric configuration. The resistive feedback network further includes: a second resistor unit coupled to the impedance matching resistor unit and the inverting input terminal; a third resistor unit coupled to the non-inverting output terminal and the inverting input terminal; a fourth resistor unit coupled to the impedance matching resistor unit and the inverting input terminal; and a fifth resistor unit coupled to the inverting output terminal and the inverting input terminal. Wherein each of the first resistor unit, the second resistor unit, the third resistor unit, the fourth resistor unit, the fifth resistor unit, and the impedance matching resistor unit includes a plurality of resistors in symmetric configuration.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
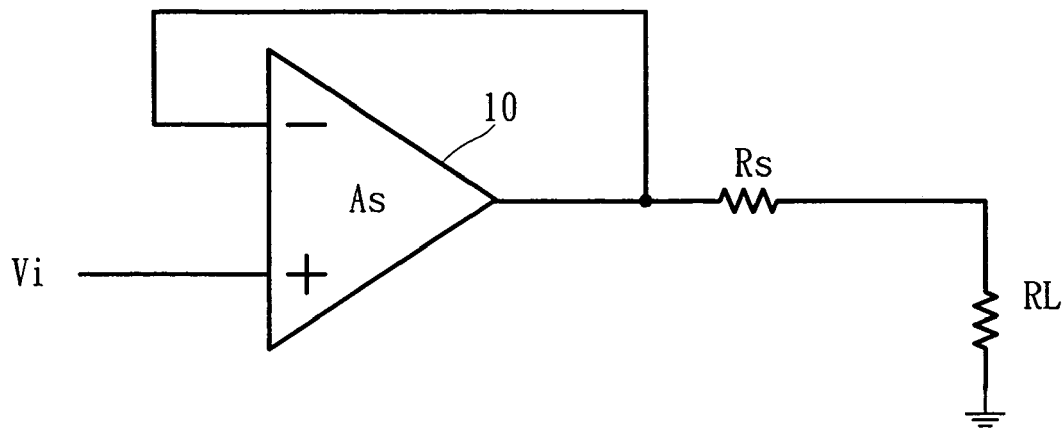
FIG. 1A is a circuit diagram of a typical line driver.
Figure 1B:
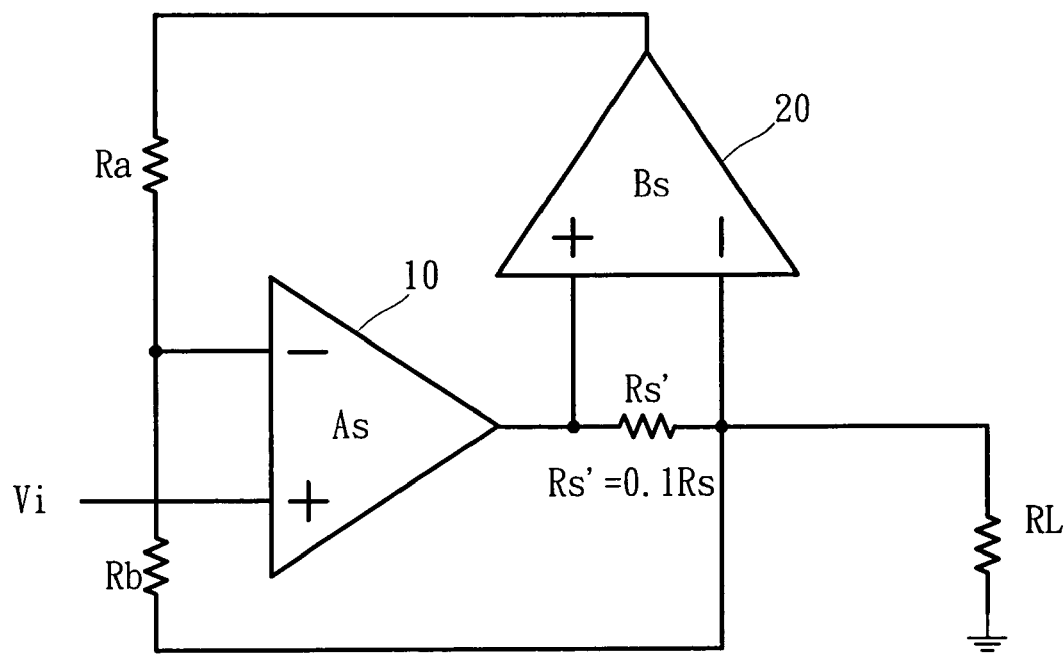
FIG. 1B is a circuit diagram of another typical line driver.
Figure 2:
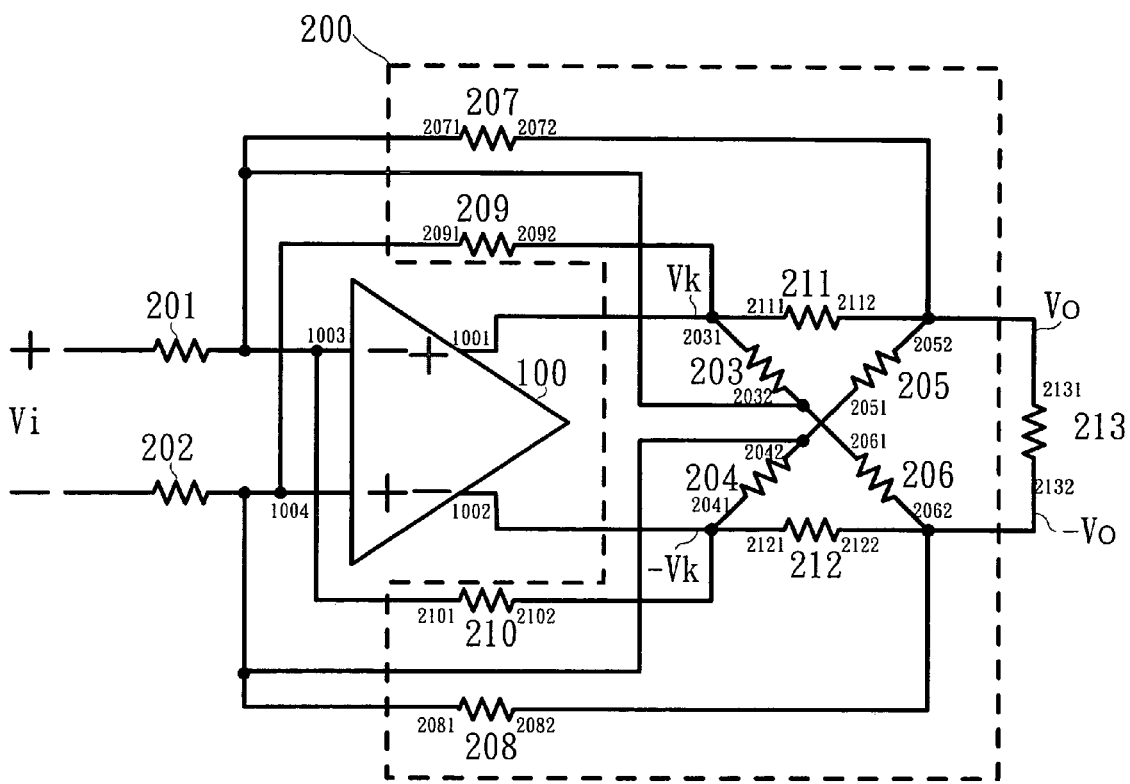
FIG. 2 is a circuit diagram of a line driver with active termination according to the first embodiment of the present invention.

FIG. 2 shows a line driver according to the first embodiment of the present invention. In FIG. 2, the line driver includes a differential amplifier 100, a first resistor 201, a second resistor 202 and a resistive feedback network 200. The differential amplifier 100 has a non-inverting output terminal 1001, an inverting output terminal 1002, an inverting input terminal 1003, and a non-inverting input terminal 1004. The first resistor 201 and the second resistor 202 are coupled to the inverting input terminal 1003 and a non-inverting input terminal 1004, respectively.

The resistive feedback network 200 has a plurality of resistors in symmetric configuration. The resistive feedback network 200 is coupled to the non-inverting output terminal 1001, the inverting output terminals 1002, the inverting input terminal 1003, and the non-inverting input terminal 1004 to form a feedback network. The output impedance of the line driver is determined by the resistive feedback network 200. In the first embodiment, the resistive feedback network 200 further includes a third resistor 203, a fourth resistor 204, a fifth resistor 205, a sixth resistor 206, a seventh resistor 207, an eighth resistor 208, a ninth resistor 209, a tenth resistor 210, a first match resistor 211 and a second match resistor 212.

A first terminal 2031 of the third resistor 203 is coupled to the non-inverting output terminal 1001 of the differential amplifier 100, a first terminal 2111 of the first match resistor 211, and a second terminal 2092 of the ninth resistor 209. A second terminal 2032 of the third resistor 203 is coupled to the inverting input terminal 1003 of the differential amplifier 100 and a first terminal 2061 of the sixth resistor 206. A first terminal 2041 of the fourth resistor 204 is coupled to the inverting output terminal 1002 of the differential amplifier 100 and a first terminal 2121 of the second match resistor 212 and a second terminal 2102 of the tenth resistor 210. A second terminal 2042 of the fourth resistor 204 is coupled to the non-inverting input terminal 1004 of the differential amplifier 100 and a first terminal 2051 of the fifth resistor 205.

A second terminal 2052 of the fifth resistor 205 is coupled to a second terminal 2112 of the first match resistor 211, a first terminal 2131 of an external load resistor 213 and a second terminal 2072 of the seventh resistor 207. The first terminal 2051 of the fifth resistor 205 is coupled to a second terminal 2042 of the fourth resistor 204. A second terminal 2062 of the sixth resistor 206 is coupled to a second terminal 2122 of the second match resistor 212, a second terminal 2132 of an external load resistor 213 and a second terminal 2082 of the eighth resistor 208. The first terminal 2061 of the sixth resistor 206 is coupled to the second terminal 2032 of the third resistor 203.

The seventh resistor 207's first terminal 2071 is coupled to the inverting input terminal 1003 of the differential amplifier 100, and its second terminal 2072 is coupled to the second terminal 2052 of the fifth resistor 205. The eighth resistor 208's first terminal 2081 is coupled to the non-inverting input terminal 1004 of the differential amplifier 100, and its second terminal 2082 is coupled to the second terminal 2062 of the sixth resistor 206.

The ninth resistor 209's first terminal 2091 is coupled to the non-inverting input terminal 1004 of the differential amplifier 100, and its second terminal 2092 is coupled to the first terminal 2031 of the third resistor 203. The tenth resistor 210's first terminal 2101 is coupled to the inverting input terminal 1003 of the differential amplifier 100, and its second terminal 2102 is coupled to the first terminal 2041 of the fourth resistor 204.

Figure 3:
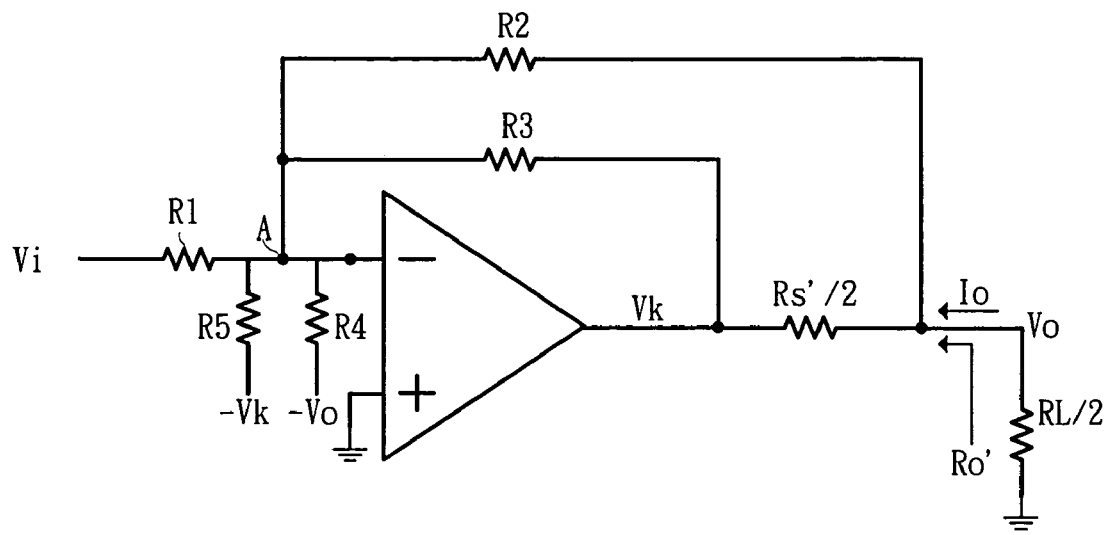
FIG. 3 is an equivalent circuit of FIG. 2.

FIG. 3 shows an equivalent circuit of FIG. 2. In FIG. 3, the third resistor 203 and the fourth resistor 204 are equivalent to a resistor R3. The fifth resistor 205 and the sixth resistor 206 are equivalent to a resistor R4. The first match resistor 211 and the second match resistor 212 are equivalent to the resistor Rs'/2. The seventh resistor 207 and the eighth resistor 208 are equivalent to the resistor R2. The ninth resistor 209 and the tenth resistor 210 are equivalent to the resistor R5. The external load resistor 213 is equivalent to the resistor RL/2.

The output impedance Ro' and the voltage gain $$\frac{Vo}{Vi}$$

of the line driver can be determined through the circuit analysis symmetric skill, which is shown by the following equations, $$\frac{Vk}{R3} + \frac{Vo}{R2} = \frac{Vo}{R4} + \frac{Vk}{R5} \Rightarrow Vk\left(\frac{1}{R3} - \frac{1}{R5}\right) = Vo\left(\frac{1}{R4} - \frac{1}{R2}\right) \because$$

$$R2 \gg Rs'/2 \Rightarrow Ro' = \frac{Vo}{Io} = \frac{Vo}{\frac{Vo - Vk}{\frac{Rs'}{2}}} = \frac{\frac{Rs'}{2}}{1 - \frac{Vk}{Vo}} = \frac{\frac{Rs'}{2}}{1 - \frac{\frac{1}{R4} - \frac{1}{R2}}{\frac{1}{R3} - \frac{1}{R5}}},$$

therefore, the output impedance $$Ro' = \frac{\frac{Rs'}{2}}{1 - \frac{R3 \,//\, (-R5)}{R4 \,//\, (-R2)}} \quad (1)$$

Because RL≠∞ and $$Vk = \left(1 + \frac{1}{k}\right)Vo,$$

where k is a constant, a node A has a current equation of:

$$\frac{Vi}{R1} - \frac{Vk}{R5} - \frac{Vo}{R4} + \frac{Vk}{R3} + \frac{Vo}{R2} = 0 \Rightarrow$$

therefore, the voltage gain $$\frac{Vo}{Vi} = \frac{1}{R1\left(\frac{1}{R4\,//\,\left(\frac{R5}{1+\frac{1}{k}}\right)} - \frac{1}{R2\,//\,\left(\frac{R3}{1+\frac{1}{k}}\right)}\right)} \quad (2)$$

Figure 4:
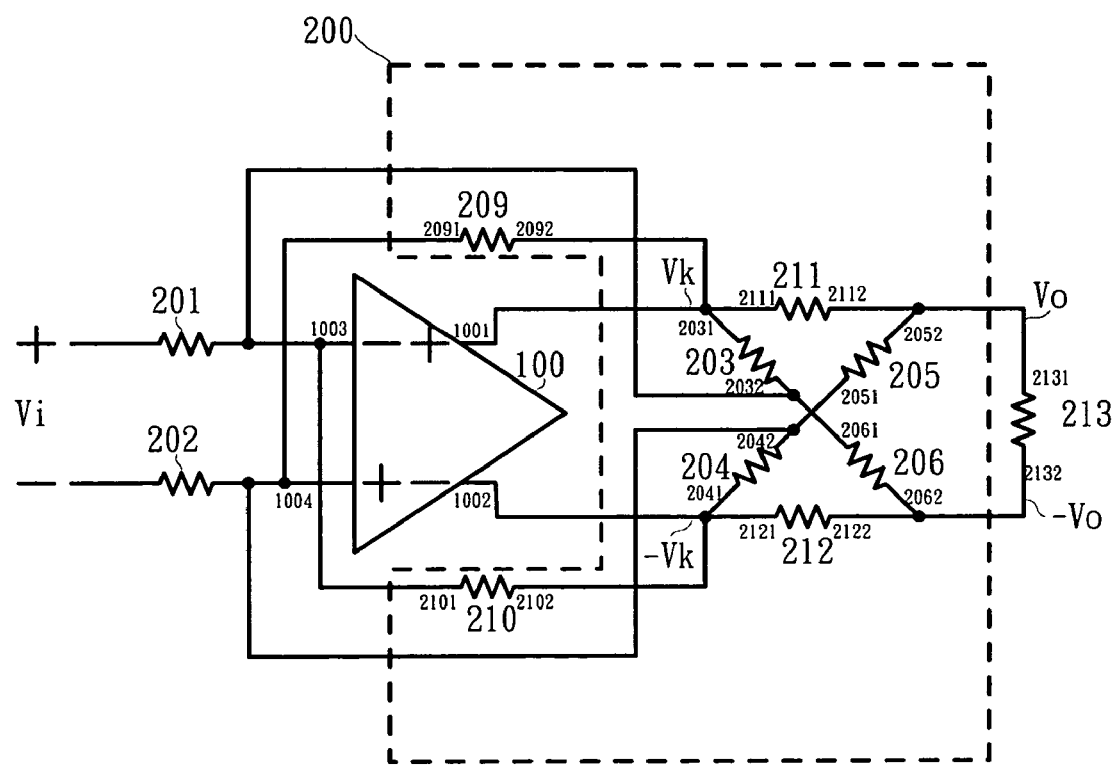
FIG. 4 is a circuit diagram of the second embodiment of the present invention.

FIG. 4 shows the line driver with active termination according to the second embodiment of the present invention. The difference between the first (shown in FIG. 2) and the second embodiment (shown in FIG. 4) is that the circuit of the second embodiment does not have the seventh resistor 207 and the eighth resistor 208. Please refer to FIG. 3, in this manner, the difference of the equivalent circuit of FIG. 4 and that of FIG. 2 is that the equivalent resistor R2 is omitted.

Also, the output impedance Ro' and the voltage gain $$\frac{Vo}{Vi}$$

of the line driver can be determined through the circuit analysis symmetric skill, which is shown by the following equations, the output impedance $$Ro' = \frac{\frac{Rs'}{2}}{1 - \frac{R3\,//\,(-R5)}{R4}}, \text{ and the voltage gain}$$

$$\frac{Vo}{Vi} = \frac{1}{R1\left(\frac{1}{R4\,//\,\left(\frac{R5}{1+\frac{1}{k}}\right)} - \frac{1}{\left(\frac{R3}{1+\frac{1}{k}}\right)}\right)}.$$

Figure 5:
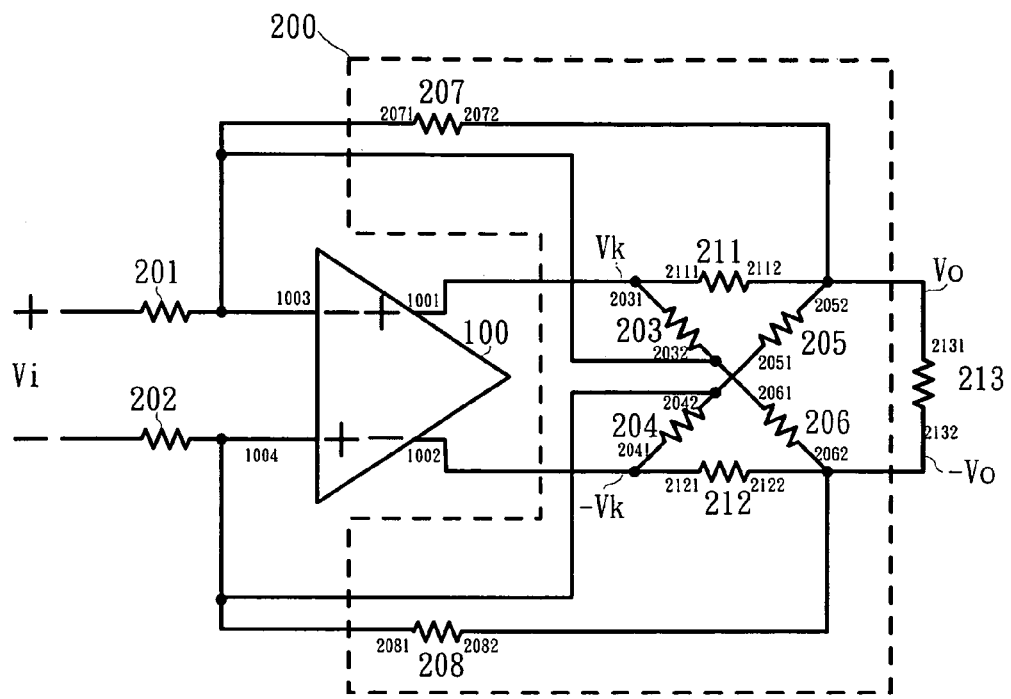
FIG. 5 is a circuit diagram of the third embodiment of the present invention.

FIG. 5 shows the line driver with active termination according to the third embodiment of the present invention. The difference between the first (shown in FIG. 2) and the third embodiment (shown in FIG. 5) is that the circuit of the third embodiment does not have the ninth resistor 209 and the tenth resistor 210. Please refer to FIG. 3, in this manner, the difference of the equivalent circuit of FIG. 5 and that of FIG. 2 is that the equivalent resistor R5 is omitted.

Also, the output impedance Ro' and the voltage gain $$\frac{Vo}{Vi}$$

of the line driver can be determined through the circuit analysis symmetric skill, which is shown by the following equations, the output impedance $$Ro' = \frac{\frac{Rs'}{2}}{1 - \frac{R3}{R4 // (-R2)}}, \text{ and the voltage}$$

$$\frac{Vo}{Vi} = \frac{1}{R1\left(\frac{1}{R4} - \frac{1}{R2 // \left(\frac{R3}{1+\frac{1}{k}}\right)}\right)}.$$

It should be noted that in the present invention, either one of the equivalent resistors R2, R3, R4, and R5 of the equivalent circuit can be omitted. And the practical resistor unit of each of the equivalent resistors R2, R3, R4, and R5 must be in symmetrical configuration.

Figure 6:
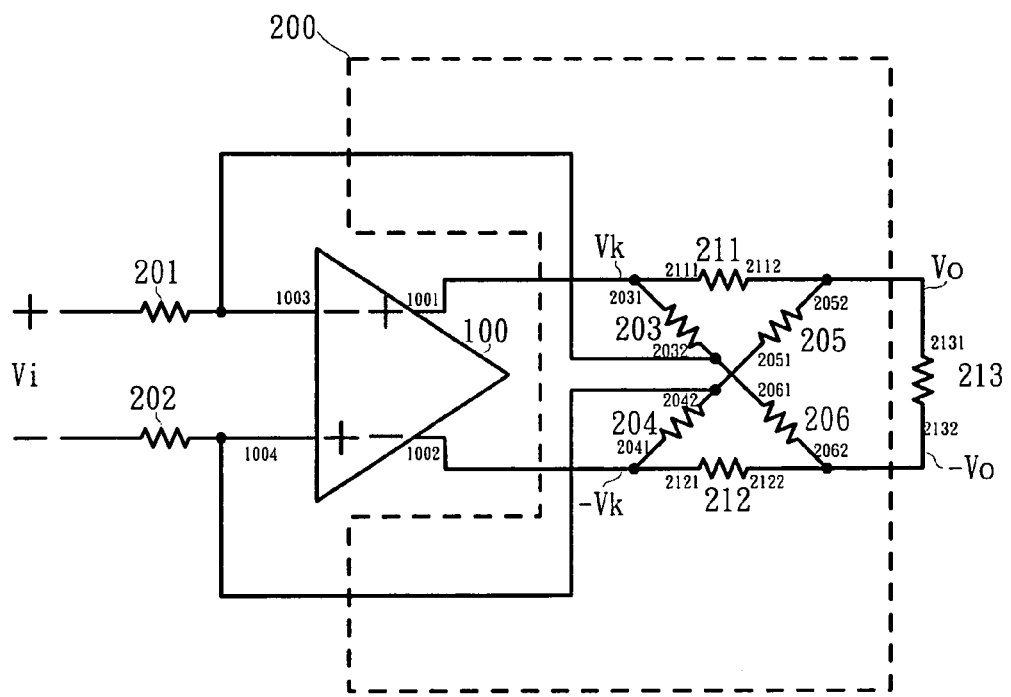
FIG. 6 is a circuit diagram of the fourth embodiment of the present invention.

FIG. 6 shows the line driver with active termination according to the fourth embodiment of the present invention. The difference between the first (shown in FIG. 2) and the fourth embodiment (shown in FIG. 6) is that the circuit of the fourth embodiment does not have the seventh resistor 207, the eighth resistor 208, the ninth resistor 209 and the tenth resistor 210. Please refer to FIG. 3, in this manner, the difference of the equivalent circuit of FIG. 5 and that of FIG. 2 is that the equivalent resistor R4 and R5 are omitted.

Also, the output impedance Ro' and the voltage gain $$\frac{V_0}{V_i}$$

of the line driver can be determined through the circuit analysis symmetric skill, which is shown by the following equations, the output impedance $$Ro' = \frac{\frac{Rs'}{2}}{1 - \frac{R3}{R4}},$$

and the voltage gain $$\frac{Vo}{Vi} = \frac{1}{R1\left(\frac{1}{R4} - \frac{\frac{1}{R3}}{1+\frac{1}{k}}\right)}.$$

As aforementioned, the number of active devices for use is reduced and the linearity of the operation range is improved in the present invention. In addition, the amplitude of a voltage signal outputted from the power source can be reduced as well.

It should be noted that in the present invention, there are several specific configurations that only two of the equivalent resistors R2, R3, R4, and R5 of the equivalent circuit are needed. The specific configurations at least includes: R2 and R3 (which means that only the equivalent resistor R2 and R3 are needed), R2 and R4, R2 and R5, R3 and R4, R3 and R5, and R4 and R5. And the practical resistor unit of each of the equivalent resistors R2, R3, R4, and R5 must be in symmetrical configuration.

Although the present invention has been explained in relation to its preferred embodiments, it is to be understood that many other possible modifications and variations can be made without departing from the spirit and scope of the invention as hereinafter claimed.

What is claimed is:

1. A line driver, comprising:
   a differential amplifier having an inverting output terminal, a non-inverting output terminal, an inverting input terminal, and a non-inverting input terminal;
   a first resistor coupled to the inverting input terminal;
   a second resistor coupled to the non-inverting input terminal; and
   a resistive feedback network, having a plurality of resistors in symmetric configuration to couple to the inverting output terminal, the non-inverting output terminal, the inverting input terminal, and the non-inverting input terminal to form a feedback network, the resistive feedback network further comprising a third resistor, a fourth resistor, a fifth resistor, a sixth resistor, a first match resistor, and a second match resistor, wherein a first terminal of the third resistor is coupled to the non-inverting output terminal and a first terminal of the first match resistor, a second terminal of the third resistor is coupled to the inverting input terminal and a first terminal of the sixth resistor, a first terminal of the fourth resistor is coupled to the inverting output terminal and a first terminal of the second match resistor, a second terminal of the fourth resistor is coupled to the non-inverting input terminal and a first terminal of the fifth resistor, a second terminal of the fifth resistor is coupled to a second terminal of the first match resistor, and a second terminal of the sixth resistor is coupled to a second terminal of the second match resistor;
   wherein the resistive feedback network further comprises a seventh resistor and an eighth resistor, wherein a first terminal of the seventh resistor is coupled to the inverting input terminal, a second terminal of the seventh resistor is coupled to the second terminal of the fifth resistor, a first terminal of the eighth resistor is coupled to the non-inverting input terminal, and a second terminal of the eighth resistor is coupled to the second terminal of the sixth resistor.

2. The line driver of claim 1, further comprising:
   a ninth resistor and a tenth resistor, wherein a first terminal of the ninth resistor is coupled to the non-inverting input terminal, a second terminal of the ninth resistor is coupled to the first terminal of the third resistor, a first terminal of the tenth resistor is coupled to the inverting input terminal, and a second terminal of the tenth resistor is coupled to the first terminal of the fourth resistor.

3. A line driver, comprising:
   a differential amplifier having an inverting output terminal, a non-inverting output terminal, an inverting input terminal, and a non-inverting input terminal;
   a first input resistor coupled to the inverting input terminal;
   a second input resistor coupled to the non-inverting input terminal;
   a first impedance matching resistor coupled to the inverting output terminal;
   a second impedance matching resistor coupled to the non-inverting output terminal; and
   a resistive feedback network, having a plurality of resistors in symmetric configuration, wherein the resistive feedback network further includes:

a first resistor unit including a first resistor connected to the first impedance matching resistor and the inverting input terminal and a second resistor connected to the second impedance matching resistor and the non-inverting input terminal;

a second resistor unit including a third resistor connected to the non-inverting output terminal and the inverting input terminal and a fourth resistor connected to the inverting output terminal and the non-inverting input terminal;

a third resistor unit including a fifth resistor connected to the second impedance matching resistor unit and the inverting input terminal and a sixth resistor connected to the first impedance matching resistor unit and the non-inverting input terminal; and a fourth resistor unit including a seventh resistor connected to the inverting output terminal and the inverting input terminal and an eighth resistor connected to the non-inverting output terminal and the non-inverting input terminal.

4. A line driver, comprising:

a differential amplifier having an inverting output terminal, a non-inverting output terminal, an inverting input terminal, and a non-inverting input terminal;

a first input resistor coupled to the inverting input terminal;

a second input resistor coupled to the non-inverting input terminal;

a first impedance matching resistor coupled to the inverting output terminal;

a second impedance matching resistor coupled to the non-inverting output terminal; and a resistive feedback network, having a plurality of resistors in symmetric configuration, wherein the resistive feedback network further includes only three of the following four resistor units comprising:

a first resistor unit including a first resistor connected to the first impedance matching resistor and the inverting input terminal and a second resistor connected to the second impedance matching resistor and the non-inverting input terminal;

a second resistor unit including a third resistor connected to the non-inverting output terminal and a fourth resistor connected to the inverting output terminal and the non-inverting input terminal;

a third resistor unit including a fifth resistor connected to the second impedance matching resistor unit and the inverting input terminal and a sixth resistor connected to the first impedance matching resistor unit and the non-inverting input terminal; and a fourth resistor unit including a seventh resistor connected to the inverting output terminal and the inverting input terminal and a-eighth an eighth resistor connected to the non-inverting output terminal and the non-inverting input terminal.

* * * * *